United States Patent
Maeda et al.

(10) Patent No.: US 6,962,007 B1
(45) Date of Patent: Nov. 8, 2005

(54) METHOD AND DEVICE FOR DRYING SUBSTRATE

(75) Inventors: Norio Maeda, Yamatokouriyama (JP); Koji Sumi, Yamatokouriyama (JP); Hiroshi Aihara, Sakai (JP); Masao Oono, Sakai (JP); Naoaki Izu Tani, Sakai (JP)

(73) Assignees: Toho Kasei Ltd., Yamatokouriyama (JP); Daikin Industries, Ltd., Osaka (JP)

( * ) Notice: Subject to any disclaimer, the term of this patent is extended or adjusted under 35 U.S.C. 154(b) by 0 days.

(21) Appl. No.: 09/889,484

(22) PCT Filed: Aug. 10, 1999

(86) PCT No.: PCT/JP99/04335

§ 371 (c)(1),
(2), (4) Date: Dec. 20, 2001

(87) PCT Pub. No.: WO00/42373

PCT Pub. Date: Jul. 20, 2000

(30) Foreign Application Priority Data

Jan. 18, 1999 (JP) .................................. 11-009338
Apr. 28, 1999 (JP) .................................. 11-122696

(51) Int. Cl.[7] .............................................. F26B 17/00

(52) U.S. Cl. ........................... 34/585; 34/426; 34/448; 34/210; 34/232; 134/36; 134/95.2

(58) Field of Search .................. 34/423, 426, 448, 34/492, 585, 210, 230, 232; 134/18, 30, 34, 134/36, 61, 66, 88, 95.2

(56) References Cited

U.S. PATENT DOCUMENTS

| | | | |
|---|---|---|---|
| 4,984,597 A | | 1/1991 | McConnell et al. |
| 5,520,744 A | | 5/1996 | Fujikawa et al. |
| 5,634,978 A | | 6/1997 | Mohindra et al. |
| 5,653,045 A | * | 8/1997 | Ferrell ........................ 34/341 |
| 5,685,086 A | * | 11/1997 | Ferrell ........................ 34/61 |
| 5,913,981 A | * | 6/1999 | Florez ........................ 134/3 |
| 6,328,814 B1 | * | 12/2001 | Fishkin et al. ................ 134/30 |
| 6,589,386 B1 | * | 7/2003 | Maeda et al. ............. 156/345.23 |

FOREIGN PATENT DOCUMENTS

| | | |
|---|---|---|
| JP | 63-301528 | 12/1988 |
| JP | 06-181198 | 6/1994 |
| JP | 6-103686 | 12/1994 |
| JP | 09213672 A1 * | 8/1997 |
| JP | 09-275084 | 10/1997 |
| JP | 10-308378 | 11/1998 |
| JP | 10-335299 | 12/1998 |
| WO | WO 97/33702 A1 | 9/1997 |

OTHER PUBLICATIONS

The Authoritative Dictionary of IEEE Standard Terms; IEEE Press; 7th Edition; 2000; p. 762.*

Primary Examiner—Henry Bennett
Assistant Examiner—Kathryn S. O'Malley
(74) Attorney, Agent, or Firm—Shinjyu Global IP Counselors, LLP.

(57) ABSTRACT

A device for drying substrates which stores a plurality of substrate (1) and which comprises a processing container (3) to which cleaning fluid (2) after cleaning the substrates (1) is drained and an injection nozzle (5) for injecting drying fluid located at the terminating part of a feed pipe (4) through which liquid drying fluid is supplied, whereby an exhaust equipment is eliminated or simplified, and the drying fluid is fed smoothly.

7 Claims, 9 Drawing Sheets

METHOD AND DEVICE FOR DRYING SUBSTRATE

TECHNICAL FIELD

The present invention relates to a method and device for drying substrates. More particularly, the present invention relates to a method and device for rapidly drying substrates which are cleaned using cleaning fluid.

RELATED ART

From the past, a device having an arrangement which is illustrated in Japanese Patent Publication Gazette No. Hei 6-103686 is proposed as a device for drying substrates (for example, semiconductor wafer or the like) after cleaning of the substrates using cleaning fluid, by relatively lowering the fluid face of the cleaning fluid with respect to the substrates and by supplying drying fluid vapor {for example, isopropyl alcohol (hereinafter referred to as IPA) vapor or the like}.

When the device is employed, a plurality of substrate housed within a processing container is cleaned using the cleaning fluid, then the drying fluid vapor is introduced within the processing container and the fluid face of the cleaning fluid is lowered, both operations are carried out simultaneously, so that a thin fluid layer of drying fluid is generated on the fluid face of the cleaning fluid. Consequently, the surface of each substrate is rapidly dried using MARANGONI effect.

When the device having the arrangement illustrated in Japanese Patent Publication Gazette No. Hei 6-103686 is employed, not only an introducing passage for introducing drying vapor but also a relief valve (exhaust opening) for exhausting drying vapor are needed for forming a flowing passage of drying vapor within the processing container so that the arrangement becomes complicated and that a dangerous condition is realized in which the drying vapor leak within a factory.

Further, in recent years when the device is applied for drying a plurality of semiconductor wafers, the semiconductor wafer is enlarged in size, and an interval of between semiconductor wafers is decreased for increasing the number of semiconductor wafers which are processed simultaneously. Under such conditions, a disadvantage arises in that introducing of the drying vapor between semiconductor wafers becomes difficult so as to generate a drying mark on the semiconductor wafers.

The present invention was made in view of the above problems.

It is an object of the present invention to offer a method and device for drying substrate in which an exhaust equipment is eliminated or simplified and for smoothly supplying drying fluid.

DISCLOSURE OF THE INVENTION

In a first embodiment of the present invention, a method for drying substrates houses substrates within a processing container, and dries a surface of each substrate by relatively lowering a fluid face of cleaning fluid within a processing container with respect to the substrate and by introducing the drying fluid within the processing container, the method comprises steps of, Introducing drying fluid under a liquid condition within the processing container, and ejecting the introduced drying fluid onto the fluid face of the cleaning fluid using a nozzle.

In a second aspect of the resent invention, a method for drying substrates of blows inert gas for atomizing the drying fluid.

In a third aspect of the present invention, a method for drying substrates intermittently introduces the drying fluid within the processing container.

In a fourth aspect of the present invention, a device for drying substrates houses substrates within a processing container, and dries a surface of each substrate by relatively lowering a fluid face of cleaning fluid within a processing container with respect to the substrate and by introducing the drying fluid within the processing container, the device comprises, Drying fluid supplying means for introducing drying fluid under a liquid condition within the processing container, and for injecting the introduced drying fluid onto the fluid face of the cleaning fluid using a nozzle.

In a fifth aspect of the present invention, a device for drying substrates further comprises blowing means for blowing inert gas for atomizing the drying fluid, the blowing means being near the drying fluid supplying means.

In a sixth aspect of the present invention, a device for drying substrates further comprises control means for controlling the drying fluid supplying means so as to intermittently introduce the drying fluid within the processing container.

In a seventh aspect of the present invention, a method for drying substrates houses substrates within a processing container, and dries a surface of each substrate by relatively lowering a fluid face of cleaning fluid within a processing container with respect to the substrate and by introducing the drying fluid within the processing container, the method comprises steps of, Conveying liquid drying fluid to exhaust opening of a nozzle using carrier gas, and Simultaneously blowing the drying fluid and the carrier gas from the exhaust opening towards an upper face of the cleaning fluid.

In an eighth aspect of the present invention, a device for drying substrates houses substrates within a processing container, and dries a surface of each substrate by relatively lowering a fluid face of cleaning fluid within a processing container with respect to the substrate and by introducing the drying fluid within the processing container, the device comprises, Drying fluid supplying means for conveying liquid drying fluid to exhaust opening of a nozzle using carrier gas, and for simultaneously blowing the drying fluid and the carrier gas from the exhaust opening towards an upper face of the cleaning fluid.

In a ninth aspect of the present invention, a device for drying substrates wherein the drying fluid supplying means comprises a first feed pipe for supplying carrier gas to the nozzle and a second feed pipe for supplying liquid drying fluid which is communicated to the halfway of the first feed pipe.

In a tenth aspect of the present invention a device for drying substrates wherein the drying fluid supplying means comprises a first feed pipe for supplying carrier gas to the nozzle and a second feed pipe for supplying liquid drying fluid to the nozzle, the first feed pipe and the second feed pipe being independently provided from one another.

When the method for drying substrates of the first aspect is employed, the method houses substrates within the processing container, and dries the surface of each substrate by relatively lowering the fluid face of cleaning fluid within the processing container with respect to the substrate and by introducing the drying fluid within the processing container. During this operation, the method introduces drying fluid under a liquid condition within the processing container, and injects the introduced drying fluid onto the fluid face of the cleaning fluid using a nozzle. Therefore, the drying fluid is smoothly introduced between the substrates due to the influence of dead weight of the liquid drying fluid so that the drying fluid is supplied with higher density with respect to the density of the vapor supplying so as to improve MARANGONI effect. Consequently, a liquid layer of the drying fluid is generated on the cleaning fluid so that drying of the substrates with greatly little drying mark is rapidly realized using MARANGONI effect. Further, the drying fluid is supplied in a liquid phase condition, so that the entirety or almost all of the drying fluid is discharged with the cleaning fluid. Consequently, leakage of the drying fluid is decreased up to nearly zero so that exhaust equipment is eliminated or is simplified. As a result, a decrease in cost is realized.

When the method for drying substrates of the second aspect is employed, the method blows inert gas for atomizing the drying fluid. Therefore, disadvantage is prevented from occurrence that droplet of the injected liquid drying fluid becomes too large, so that superior drying of the substrates is realized. In addition, operations and effects are realized which are similar to those of the first aspect.

When the method for drying substrates of the third aspect is employed, the method intermittently introduces the drying fluid within the processing container. Therefore, increase in consumption quantity of the drying fluid following the supplying of the drying fluid in a liquid condition is suppressed. In addition, operations and effects are realized which are similar to those of the first aspect or the second aspect.

When the device for drying substrates of the fourth aspect is employed, the device houses substrates within the processing container, and the device dries the surface of each substrate by relatively lowering the fluid face of cleaning fluid within the processing container with respect to the substrate and by introducing the drying fluid within the processing container.

During this operation, the drying fluid supplying means introduces drying fluid under a liquid condition within the processing container, and injects the introduced drying fluid onto the fluid face of the cleaning fluid using a nozzle.

Therefore, the drying fluid is smoothly introduced between the substrates due to the influence of dead weight of the liquid drying fluid so that the drying fluid is supplied with higher density with respect to the density of the vapor supplying so as to improve MARANGONI effect. Consequently, a liquid layer of the drying fluid is generated on the cleaning fluid so that drying of the substrates with greatly little drying mark is rapidly realized using MARANGONI effect. Further, the drying fluid is supplied in a liquid phase condition, so that the entirety or almost of the drying fluid is discharged with the cleaning fluid. Consequently, leakage of the drying fluid is decreased up to nearly zero so that exhaust equipment is eliminated or is simplified. As a result, decrease in cost is realized.

When the device for drying substrates of the fifth aspect is employed, the device further comprises blowing means for blowing inert gas for atomizing the drying fluid, the blowing means being near the drying fluid supplying means. Therefore, disadvantage is prevented from occurrence that droplet of the injected liquid drying fluid becomes too large, so that superior drying of the substrates is realized. In addition, operations and effects are realized which are similar to those of the fourth aspect.

When the device for drying substrates of the sixth aspect is employed, the device further comprises control means for controlling the drying fluid supplying means so as to intermittently introduce the drying fluid within the processing container. Therefore, increase in consumption quantity of the drying fluid following the supplying of the drying fluid in a liquid condition is suppressed. In addition, operations and effects are realized which are similar to those of the fourth aspect or the fifth aspect.

When the method for drying substrates of the seventh aspect is employed, the method houses substrates within the processing container, and dries the surface of each substrate by relatively lowering the fluid face of cleaning fluid within the processing container with respect to the substrate and by introducing the drying fluid within the processing container. During this operation, the method conveys liquid drying fluid to exhaust opening of the nozzle using carrier gas, and the method simultaneous blows the drying fluid and the carrier gas from the exhaust opening towards the upper face of the cleaning fluid.

Therefore, the drying fluid is smoothly introduced between the substrates due to the influence of dead weight of the liquid drying fluid so that the drying fluid is supplied with higher density with respect to the density of the vapor supplying so as to improve MARANGONI effect. Consequently, a liquid layer of the drying fluid is generated on the cleaning fluid so that drying of the substrates with greatly little drying mark is rapidly realized using MARANGONI effect. Further, the drying fluid is supplied in a liquid phase condition, so that the entirety or almost of the drying fluid is discharged with the cleaning fluid. Consequently, leakage of the drying fluid is decreased up to nearly zero so that exhaust equipment is eliminated or is simplified. As a result, decrease in cost is realized. Furthermore, the blowing quantity of the drying fluid from the blowing opening of the nozzle is suppressed so that the drying fluid of proper quantity is supplied to the dipping boundary face of the substrates. Consequently, usage quantity of the drying fluid is decreased and the running cost is decreased.

When the device for drying substrates of the eighth aspect is employed, the device houses substrates within the processing container, and the device dries the surface of each substrate by relatively lowering the fluid face of cleaning fluid within the processing container with respect to the substrate and by introducing the drying fluid within the processing container. During this operation, the drying fluid supplying means conveys liquid drying fluid to exhaust opening of the nozzle using carrier gas, and simultaneously blows the drying fluid and the carrier gas from the exhaust opening towards the upper face of the cleaning fluid.

Therefore, the drying fluid is smoothly introduced between the substrates due to the influence of dead weight of the liquid drying fluid so that the drying fluid is supplied with higher density with respect to the density of the vapor supplying so as to improve MARANGONI effect. Consequently, a liquid layer of the drying fluid is generated on the cleaning fluid so that drying of the substrates with greatly little drying mark is rapidly realized using MARANGONI effect. Further, the drying fluid is supplied in a liquid phase condition, so that the entirety or almost of the drying fluid is discharged with the cleaning fluid. Consequently, leakage of the drying fluid is decreased up to nearly zero so that exhaust equipment is eliminated or is simplified. As a result, decrease in cost is realized. Furthermore, the blowing quantity of the drying fluid from the blowing opening of the nozzle is suppressed so that the drying fluid of proper quantity is supplied to the dipping boundary face of the substrates. Consequently, usage quantity of the drying fluid is decreased and the running cost is decreased.

When the device for drying substrates of the ninth aspect is employed, the drying fluid supplying means comprises a first feed pipe for supplying carrier gas to the nozzle and a second feed pipe for supplying liquid drying fluid which is communicated to the halfway of the first feed pipe. Therefore, the blowing quantity of the drying fluid from each blowing opening is determined to be a proper quantity so that the consumption quantity of the drying fluid is decreased and the cost is decreased. In addition, operations and effects are realized which are similar to those of the eighth aspect.

When the device for drying substrates of the tenth aspect is employed, the drying fluid supplying means comprises a first feed pipe for supplying carrier gas to the nozzle and a second feed pipe for supplying liquid drying fluid to the nozzle, the first feed pipe and the second feed pipe being independently provided from one another. Therefore, the liquid drying fluid is guided by the carrier gas to the blowing opening within the nozzle. In addition, operations and effects are realized which are similar to those of the eighth aspect.

BEST MODE FOR CARRYING OUT THE INVENTION

Hereinafter, referring to the attached drawings, we explain a method and device for drying substrate of an embodiment according to the present invention in detail.

Figure 1:
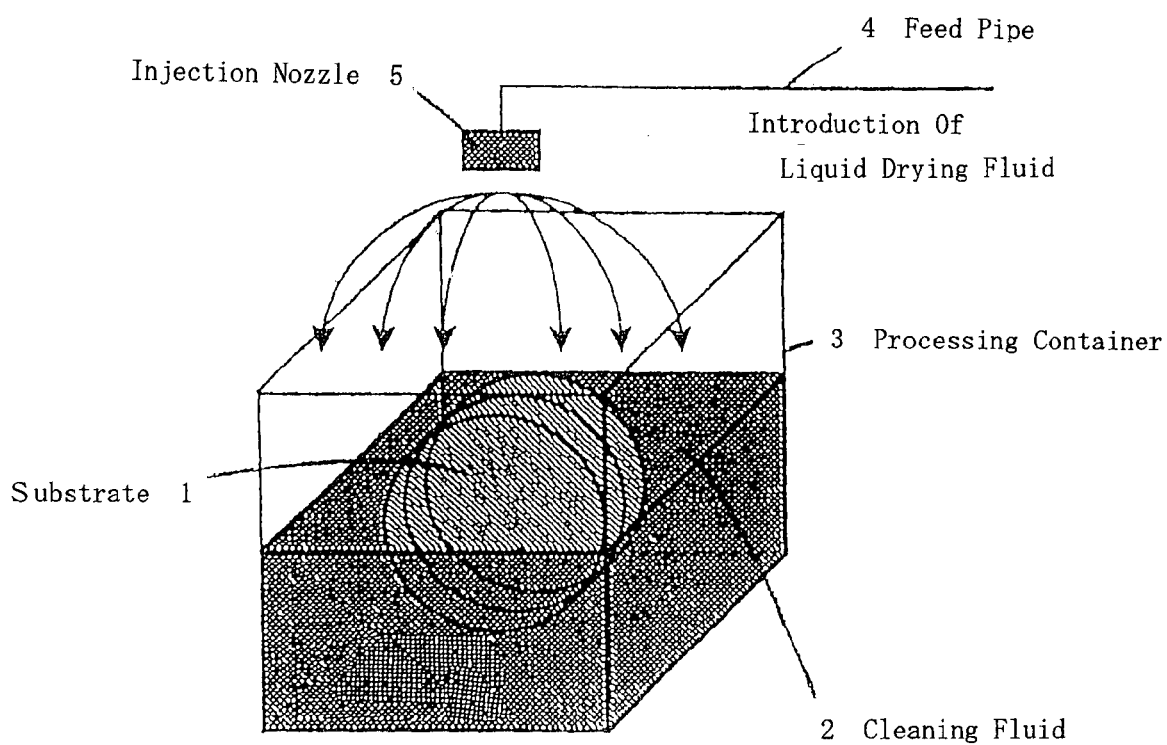
FIG. 1 is a schematic perspective view of a device for drying substrate of an embodiment according to the present invention.

FIG. 1 is a schematic perspective view of a device for drying substrate of an embodiment according to the present invention.

The device for drying substrate has a processing container 3 for housing a plurality of substrate 1, and for discharging cleaning fluid (for example, pure water) 2 which has cleaned the substrates 1. The device also has a feed pipe 4 for supplying liquid drying fluid (for example, IPA), and an injection nozzle 5 for injecting the drying fluid which is provided at the end section of the feed pipe 4. Of course, the injection nozzle 5 is disposed above the substrate 1.

Operation of the device for drying substrate having the above arrangement is as follows.

After the substrates 1 have been cleaned by housing the cleaning fluid 2 within the processing container 3 in which the substrates 1 are housed, the fluid face of the cleaning fluid 2 is lowered by discharging the cleaning fluid 2 from the processing container 3 and the drying fluid is supplied through the feed pipe 4 and is injected by the injection nozzle 5. As a result, a fluid layer of the injected drying fluid is formed on the surface of the cleaning fluid 2 so that portions exposed from the surface of the cleaning fluid 2 among the plurality of substrates 1 are rapidly dried without drying marks due to the MARANGONI effect.

When portions to some degree among the plurality of substrate 1 are positioned above the surface of the cleaning fluid 2, mist conditioned drying fluid injected from the injection nozzle 5 smoothly intrudes into the clearance between substrates 1 by the dead weight thereof so that a fluid layer of the injected drying fluid is formed on the surface of the cleaning fluid 2 for those portions. Therefore, rapid drying without drying mark due to MARANGONI effect is continued.

When the above series of drying operations is carried out, almost all drying fluid supplied in a liquid condition is discharged with the cleaning fluid 2 from the processing container 3 to an outer section so that the drying fluid scarcely leaks into neighboring sections with respect to the processing container 3. As a result, an exhausting equipment for exhausting the drying fluid is eliminated or simplified so as to realize a decrease in cost.

Figure 2:
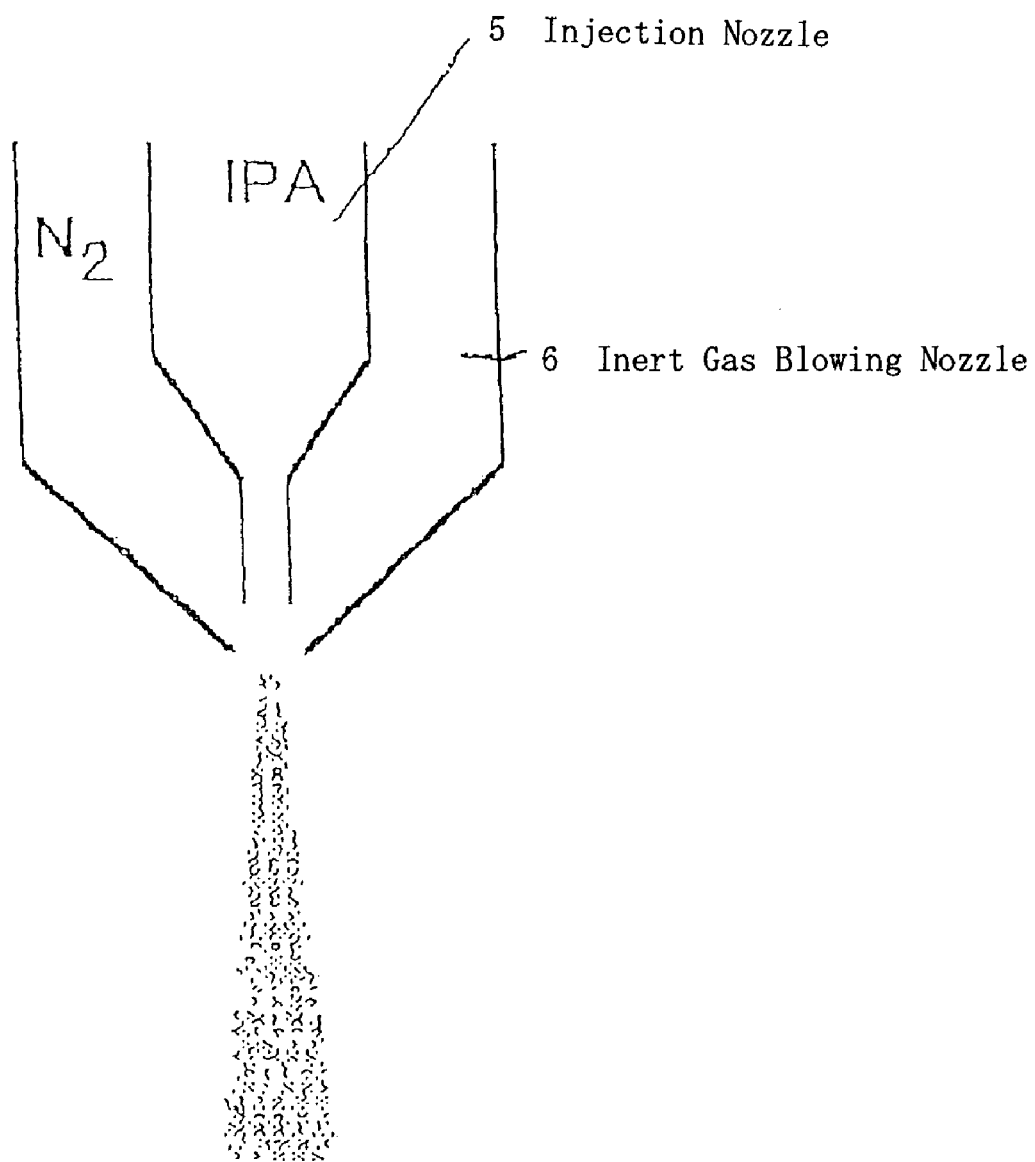
FIG. 2 is a schematically vertical cross sectional view illustrating another arrangement of an injection nozzle.

FIG. 2 is a schematic vertical cross sectional view illustrating another arrangement of an injection nozzle 5.

The injection nozzle 5 is surrounded by an inert gas blowing nozzle 6 for blowing inert gas (for example, nitrogen gas) therefrom.

When the injection nozzle 5 having the above arrangement is employed, nitrogen blowing is carried out as inert gas blowing against the injected drying fluid so that the injected drying fluid is prevented from becoming too large in size. Therefore, drying of the substrates 1 with high quality is realized. Wherein, the nitrogen gas may be the nitrogen gas with usual temperature, but the nitrogen gas is preferable to be the nitrogen gas with increased temperature of about 100° C. so as to improve the above operation and effect.

Figure 3:
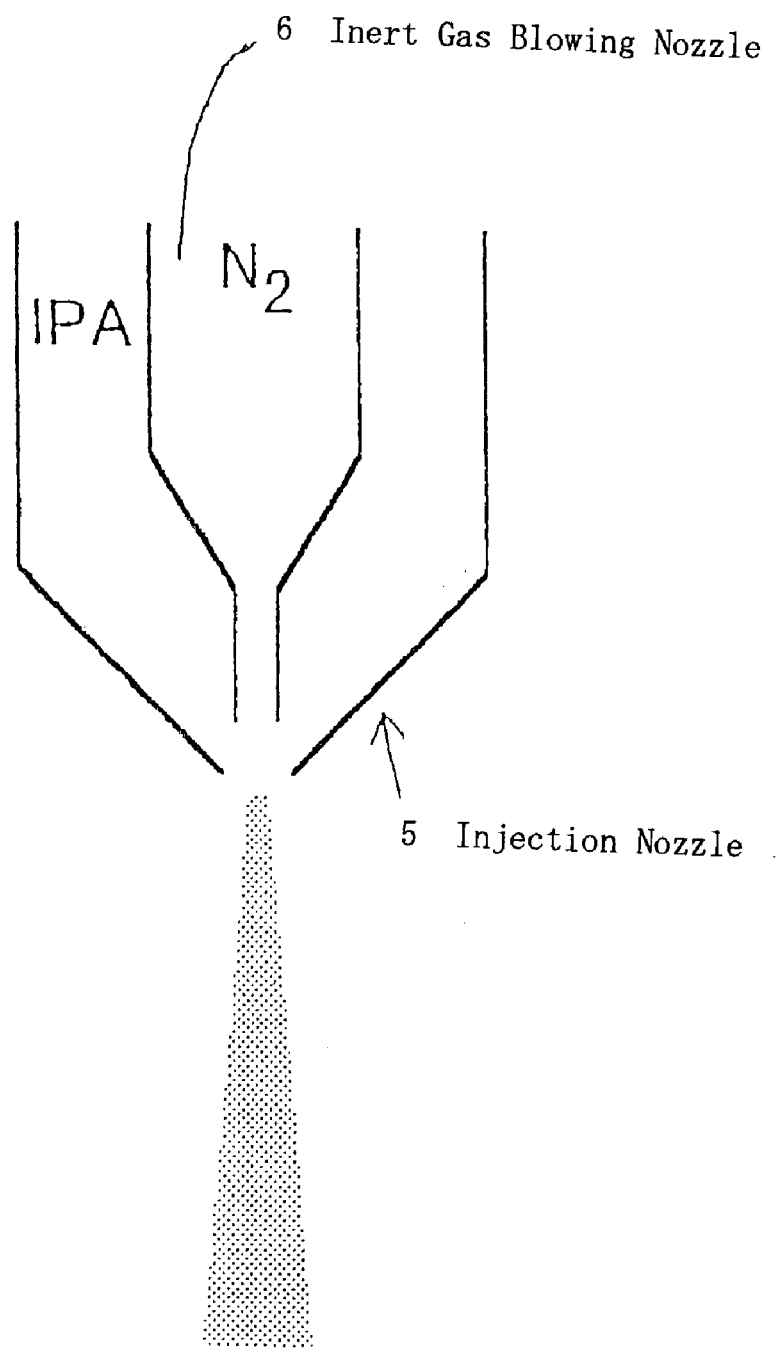
FIG. 3 is a schematic vertical cross sectional view illustrating a further arrangement of an injection nozzle.

FIG. 3 is a schematic vertical cross sectional view illustrating a further arrangement of an injection nozzle 5.

The injection nozzle 5 surrounds an inert gas blowing nozzle 6 for blowing inert gas therefrom.

When the injection nozzle 5 having the above arrangement is employed, operation and effect are realized which are similar to those of the case in which the injection nozzle 5 illustrated in FIG. 2 is employed.

Figure 4:
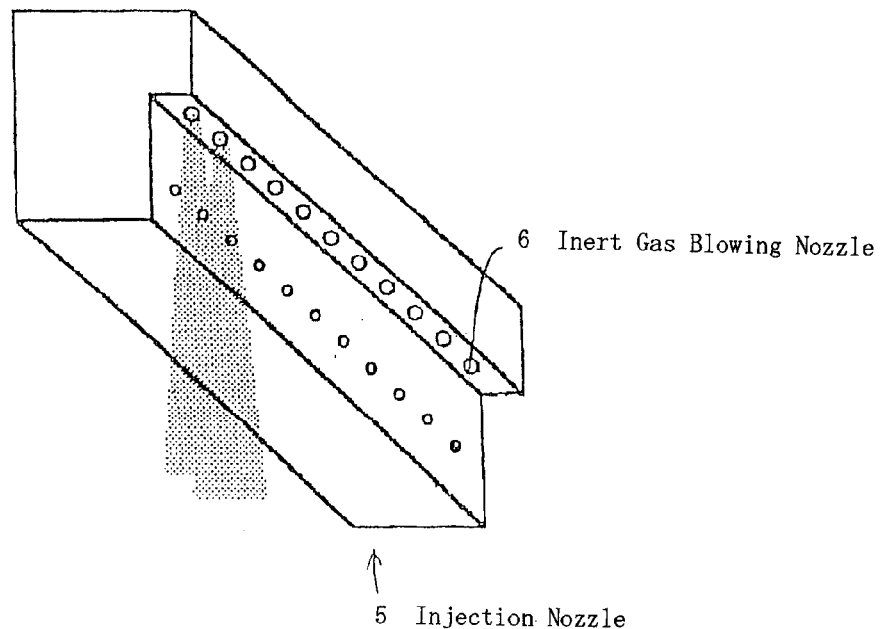
FIG. 4 is a schematic vertical cross sectional view illustrating yet another arrangement of an injection nozzle.

FIG. 4 is a schematic vertical cross sectional view illustrating yet another arrangement of an injection nozzle 5.

The injection nozzle 5 injects the drying fluid in a horizontal direction, and an inert gas blowing nozzle 6 is provided for blowing nitrogen gas with usual temperature or high temperature as inert gas from an upper position with respect to the injected drying fluid.

When the injection nozzle 5 having the above arrangement is employed, operation and effect are realized which are similar to those of the case in which the injection nozzle 5 illustrated in FIG. 2 is employed.

Figure 5:
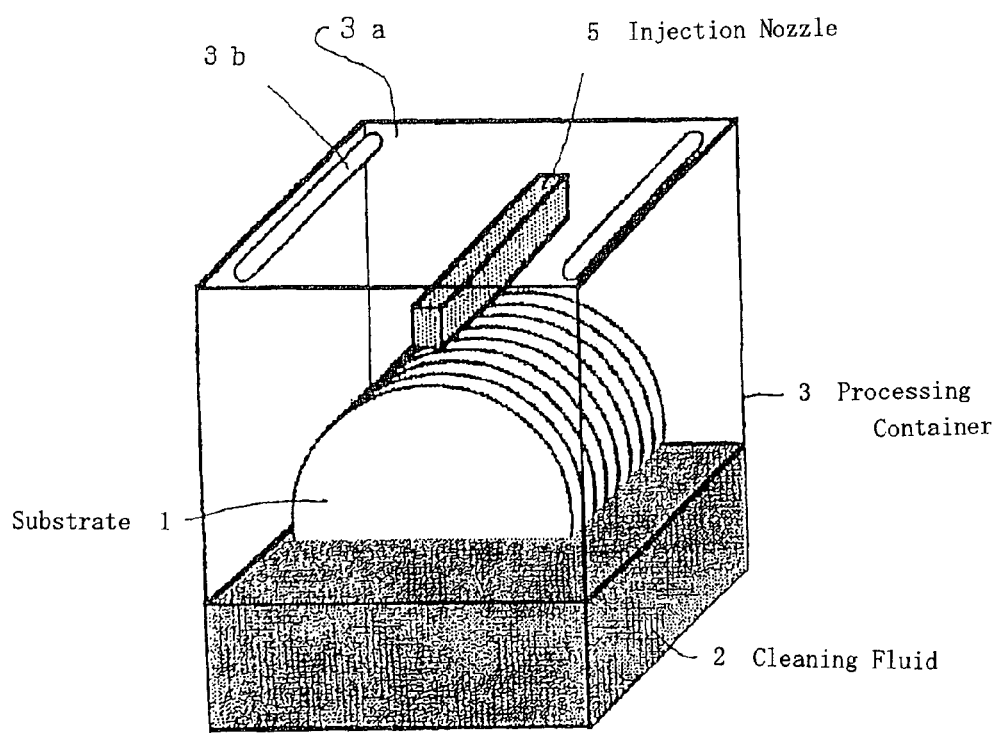
FIG. 5 is a schematic perspective view of a device for drying substrate of another embodiment according to the present invention.
Figure 6:
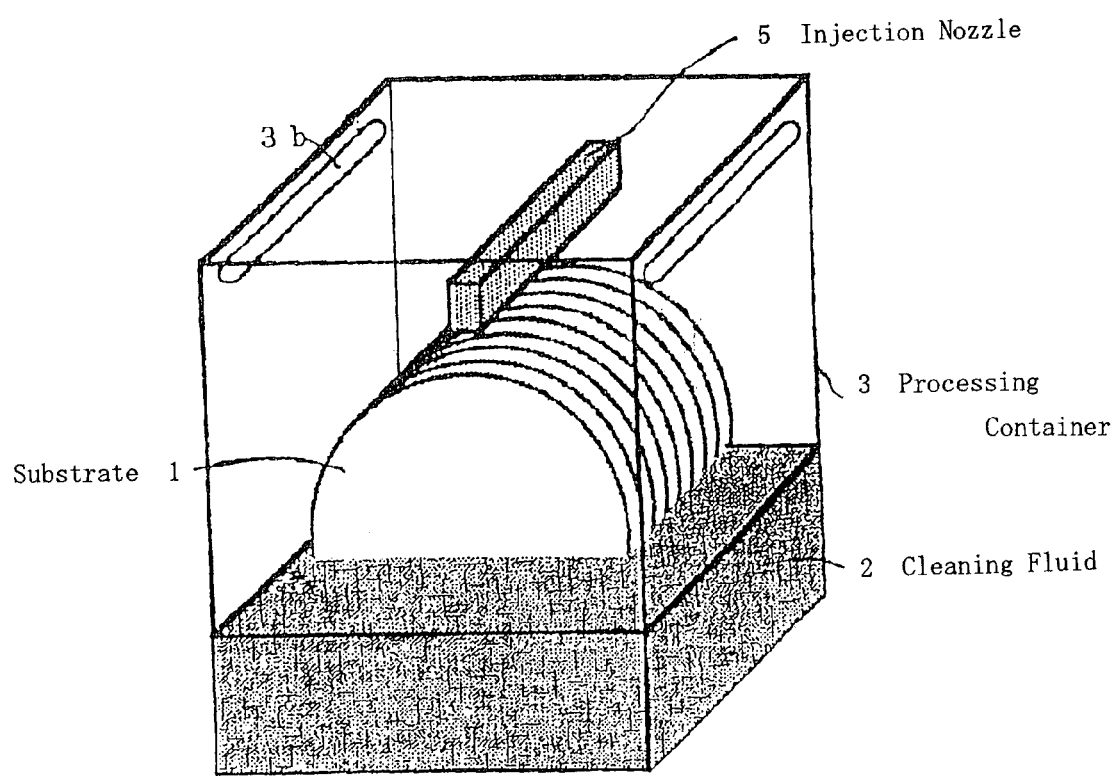
FIG. 6 is a schematic perspective view of a device for drying substrate of a further embodiment according to the present invention.
Figure 7:
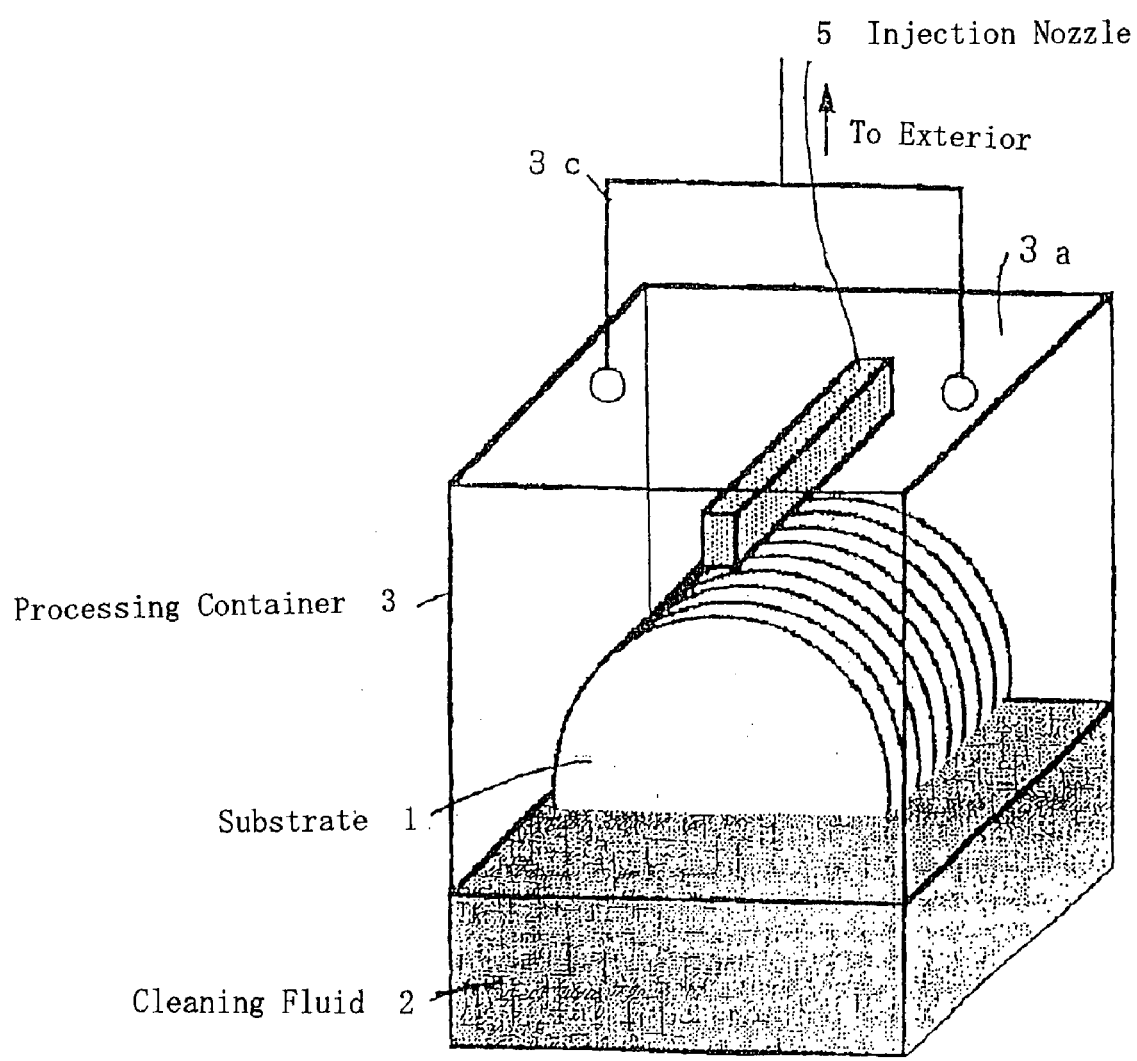
FIG. 7 is a schematic perspective view of a device for drying substrate of yet another embodiment according to the present invention.
Figure 8:
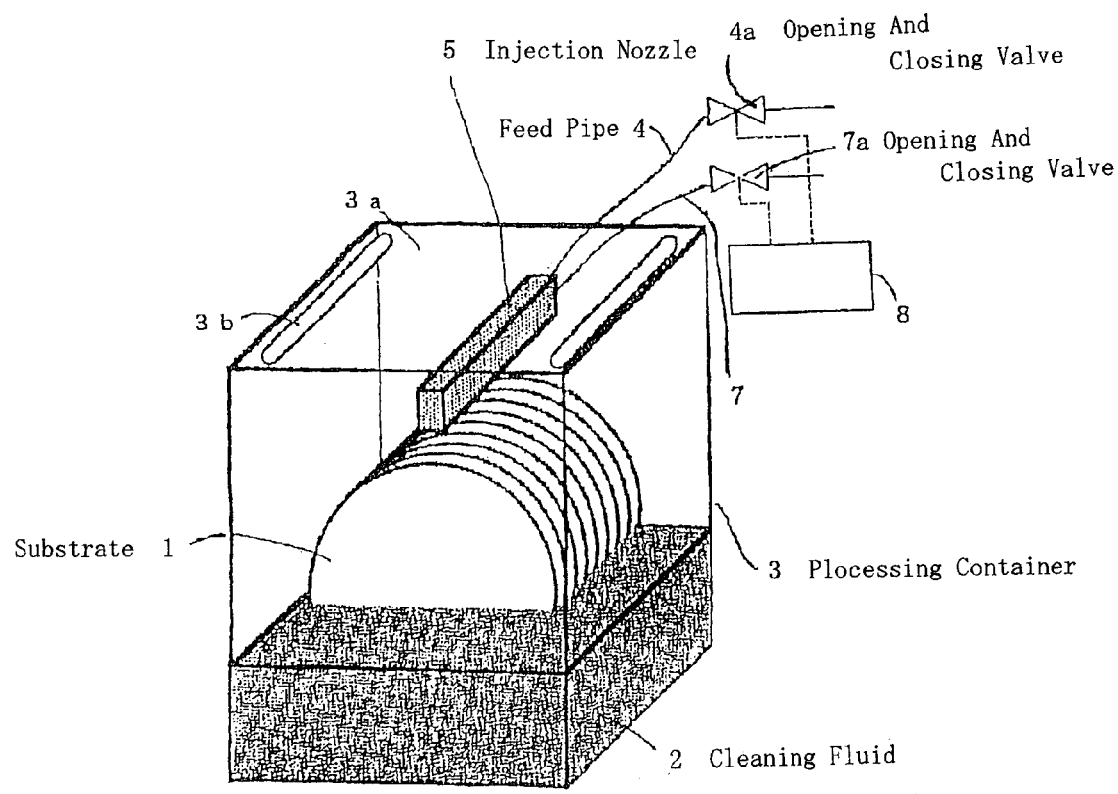
FIG. 8 is a schematic perspective view of a device for drying substrate of a yet further embodiment according to the present invention.
Figure 9:
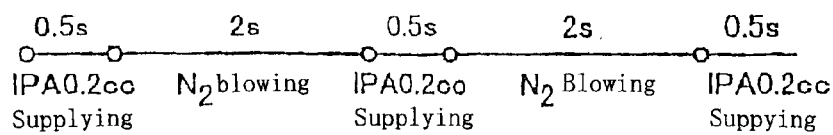
FIG. 9 is a timing chart useful in understanding intermittent introduction of drying fluid and intermittent blowing of high temperature nitrogen gas.
Figure 10:
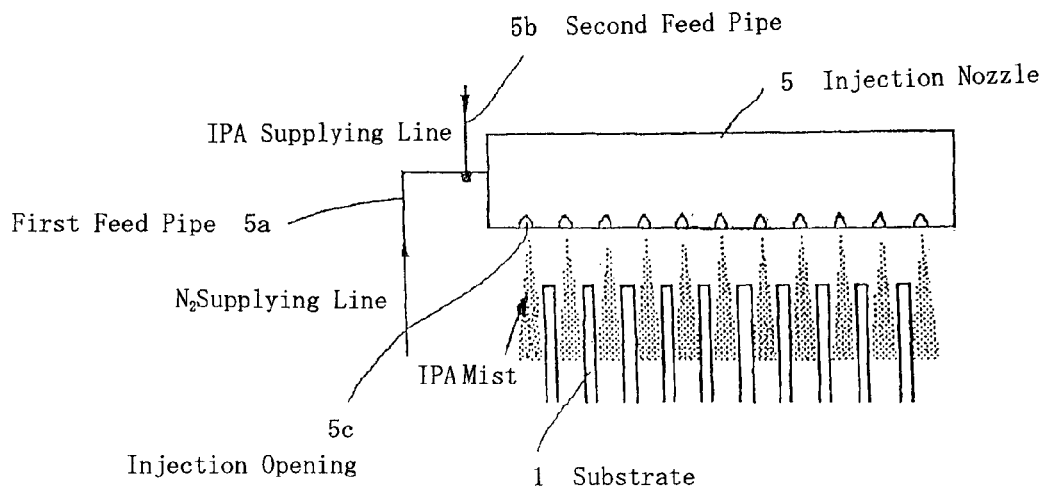
FIG. 10 is a perspective view illustrating a main portion of a device for drying substrate of a further embodiment according to the present invention.

FIG. 5 is a schematic perspective view of a device for drying substrate of another embodiment according to the present invention.

The device for drying substrate is different from the embodiment illustrated in FIG. 1 in that the injection nozzle 5 having the arrangement of one of FIGS. 2~4 is employed, and that an exhausting slit opening 3b is provided at a predetermined position of a cover body 3a of the processing container 3.

When the device for drying substrate having the above arrangement is employed, steady flow of the inert gas is formed by exhausting the inert gas through the exhausting slit opening 3b which inert gas is introduced within the processing container 3 by inert gas blowing. Consequently, the injected drying fluid is prevented from becoming too large in size. As a result, rapid drying without drying mark of the substrates 1 is realized.

When the above arrangement is employed, there is a possibility that the drying fluid is exhausted through the exhausting slit opening 3*b*. But, the quantity of the drying fluid exhausted through the exhausting slit opening 3*b* is remarkably small so that disadvantage does not arise, because almost drying fluid is injected towards the surface of the cleaning fluid 2 so as to form the fluid layer on the surface.

FIG. 6 is a schematic perspective view of a device for drying substrate of a further embodiment according to the present invention.

The device for drying substrate is different from the embodiment illustrated in FIG. 5 in that an exhausting slit opening 3*b* is provided at an upper section of a side wall of the processing container 3.

When this arrangement is employed, operation and effect are realized which are similar to those of the device for drying substrate illustrated in FIG. 5.

FIG. 7 is a schematic perspective view of a device for drying substrate of yet another embodiment according to the present invention.

The device for drying substrate is different from the embodiment illustrated in FIG. 5 in that an exhausting pipe 3*c* is provided at a predetermined position of a cover body 3*a* of the processing container 3.

When this arrangement is employed, leakage of the drying fluid is securely prevented. In addition, operation and effect are realized which are similar to those of the device for drying substrate illustrated in FIG. 5.

FIG. 8 is a schematic perspective view of a device for drying substrate of a yet further embodiment according to the present invention.

The device for drying substrate is different from the embodiment illustrated in FIG. 5 in that an opening and closing valve 4*a* is provided at a predetermined position of the feed pipe 4 for supplying drying fluid to the injection nozzle 5, that an opening and closing valve 7*a* is provided at a predetermined position of a feed pipe 7 for supplying nitrogen gas to the nitrogen gas blowing nozzle 6, and that a valve control section 8 is provided for controlling the opening and closing valves 4*a* and 7*a*.

When the device for drying substrate having the above arrangement is employed, the drying fluid is intermittently introduced within the processing container 3 by periodically opening and closing the opening and closing valve 4*a*. Therefore, consumption quantity of the drying fluid is decreased in comparison with consumption quantity of the drying fluid when it is continuously introduced.

Specifically, as is illustrated in FIG. 9 for example, injection of the drying fluid is carried out for 0.5 seconds, then blowing of only the nitrogen gas with high temperature is carried out for 2 seconds, thereafter the valve control section 8 controls both opening and closing valves 4*a* and 7*a* so as to repeat the injection of the drying fluid and the blowing of only the nitrogen gas with high temperature. When this operation is carried out, the consumption quantity of the drying fluid and the consumption quantity of the nitrogen gas with high temperature are decreased in comparison with the consumption quantity of the drying fluid and the consumption quantity of the nitrogen gas with high temperature when the drying fluid is continuously introduced and when the nitrogen gas with high temperature is continuously blown for atomizing the drying fluid. The decreasing rate of the consumption quantity of the drying fluid is about 80%, while the decreasing rate of the consumption quantity of the nitrogen gas with high temperature is about 20%.

This specific example introduces the drying fluid for 0.5 seconds at every 2.5 seconds. The introduction interval of the drying fluid and the introduction quantity of the drying fluid at every introduction can be determined following the lowering speed of the surface of the cleaning fluid for carrying out drying of the substrates due to MARANGONI effect.

In the above embodiments, the surface of the cleaning fluid 2 is lowered by discharging the cleaning fluid 2. Instead the discharging of the cleaning fluid 2, it is possible that drying is carried out following moving upward of the plurality of substrate 1.

FIG. 10 is a perspective view illustrating a main portion of a device for drying substrate of a further embodiment according to the present invention. The arrangement of each portion which is not illustrated is similar to that of the above embodiment, therefore detailed description is omitted.

The device for drying substrate has a first feed pipe 5*a* for supplying carrier gas (for example, nitrogen gas) to the injection nozzle 5, and a second feed pipe 5*b* for supplying liquid drying fluid, the second feed pipe 5*b* being communicated to halfway of the first feed pipe 5*a*. Further, injection openings 5*c* of the injection nozzle 5 are determined their positions so that the injection openings 5*c* correspond to clearances of the substrates 1.

When the device for drying substrate of this embodiment is employed, the carrier gas is supplied to the injection nozzle 5 through the first feed pipe 5*a* so as to generate negative pressure at the position corresponding to the opening of the second feed pipe 5*b*. Consequently, the liquid drying fluid is sucked into the first feed pipe 5*a* due to the negative pressure, then the drying fluid is supplied to the injection nozzle 5 with the carrier gas. Then, mist of the drying fluid is blown from the injection opening 5*c* of the injection nozzle 5. Drying of the substrates 1 is realized by the mist as similar as the operation of the above embodiment.

When this embodiment is employed, blowing quantity of the drying fluid from the injection nozzle 5 is suppressed so that proper amount of the drying fluid is supplied to the dipping boundary face of each substrate 1. As a result, usage quantity of the drying fluid is decreased, and the running cost is decreased.

Figure 11:
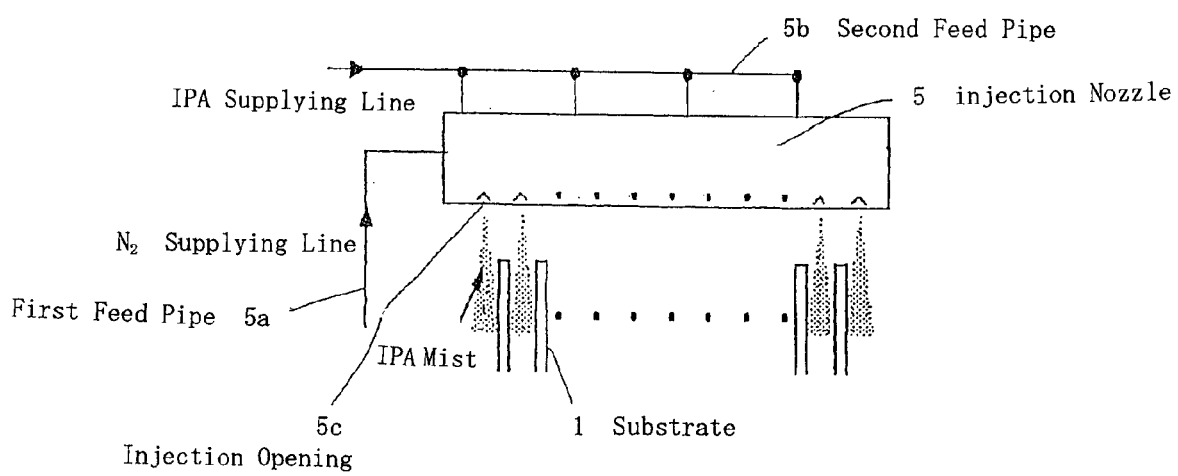
FIG. 11 is a perspective view illustrating a main portion of a device for drying substrate of yet another embodiment according to the present invention.

FIG. 11 is a perspective view illustrating a main portion of a device for drying substrate of yet another embodiment according to the present invention. The arrangement of each portion which is not illustrated is similar to that of the above embodiment, therefore detailed description is omitted.

The device for drying substrate has a first feed pipe 5a for supplying carrier gas to the injection nozzle 5, the first feed pipe 5a being communicated to one end face of the injection nozzle 5 in a longitudinal direction, and has a second feed pipe 5b for supplying liquid drying fluid, the second feed pipe 5b being communicated to a face of the injection nozzle 5 which face is neighboring to the one end face. Further, injection openings 5c of the injection nozzle 5 are determined their positions so that the injection openings 5c correspond to clearances of the substrates 1.

When the device for drying substrate of this embodiment is employed, the carrier gas is supplied to the injection nozzle 5 through the first feed pipe 5a so that the inner pressure within the injection nozzle 5 becomes high pressure because the injection openings 5c are small in size. And, liquid drying fluid is supplied into the injection nozzle 5 by supplying the liquid drying fluid with higher pressure with respect to the inner pressure through the second feed pipe 5b. Then, mist of the drying fluid is blown from the injection openings 5c of the injection nozzle 5. Drying of the substrates 1 is realized by the mist as similar as the operation of the above embodiment.

When this embodiment is employed, blowing quantity of the drying fluid from the injection nozzle 5 is suppressed so that proper amount of the drying fluid is supplied to the dipping boundary face of each substrate 1. As a result, usage quantity of the drying fluid is decreased, and the running cost is decreased.

Figure 12:
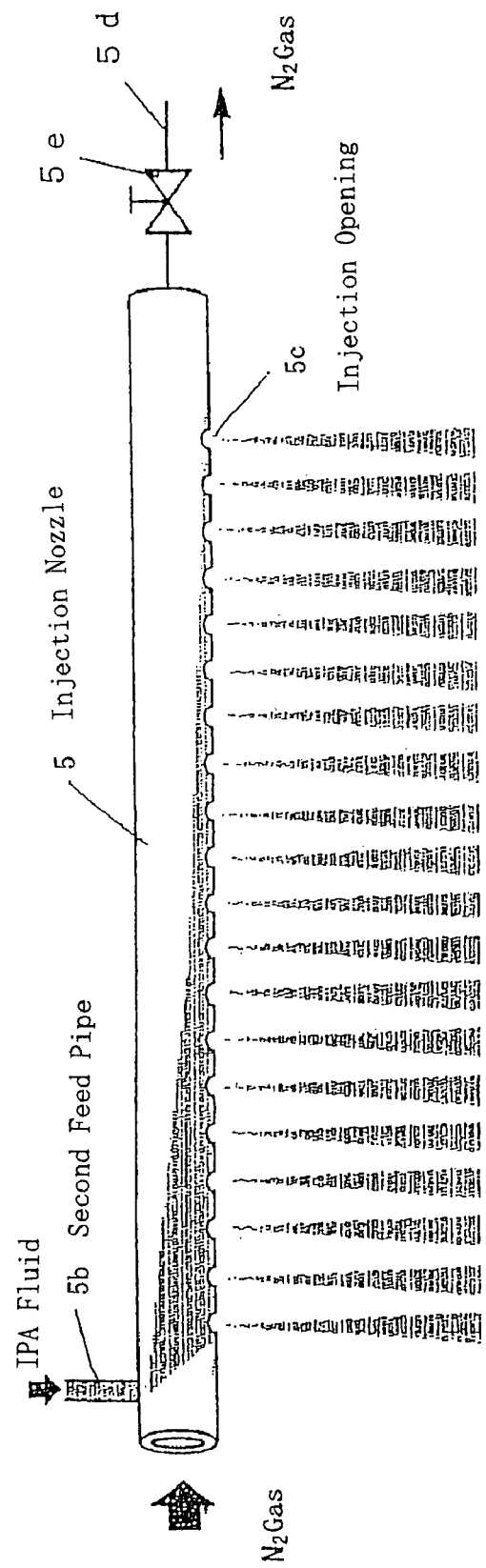
FIG. 12 is a perspective view illustrating a main portion of a device for drying substrate of a yet further embodiment according to the present invention.

FIG. 12 is a perspective view illustrating a main portion of a device for drying substrate of a yet further embodiment according to the present invention. The arrangement of each portion which is not illustrated is similar to that of the above embodiment, therefore detailed description is omitted.

The device for drying substrate is different from the device for drying substrate illustrated in FIG. 11 in that an exhaust pipe 5d is provided for exhausting carrier gas, the exhausting pipe 5d being communicated with the other end face of the injection nozzle 5 in a longitudinal direction, that a valve 5e is provided at a predetermined position of the exhausting pipe 5d, and that the second feed pipe 5b is communicated with the injection nozzle 5 only at the most upstream side thereof.

When this embodiment is employed, the rate of the carrier gas blown from the injection openings 5c and the carrier gas exhausted through the exhausting pipe 5d is controlled by controlling the opening of the valve 5e. The liquid drying fluid supplied to the injection nozzle 5 through the second supplying is accelerated by the carrier gas, and the liquid drying fluid is supplied in the entire extent from the most upstream side injection opening 5c to the most downstream side injection opening 5c, so that mist of drying fluid is blown from every injection opening 5c. Of course, the blown drying fluid is made to be fine mist by the carrier gas. Therefore, drying of the substrates 1 with high quality is realized.

INDUSTRIAL APPLICABILITY

The present invention can be applied to the drying of substrates such as semiconductor wafers or the like. Drying of the substrates with high quality is realized.

What is claimed is:

1. A method for drying substrates comprising the steps of:
housing substrates within a processing container that contains a cleaning fluid;
lowering a fluid face of the cleaning fluid within the processing container with respect to the substrates; and
conveying a liquid drying fluid to an exhaust opening of a nozzle using a carrier gas, and simultaneously blowing the drying fluid and the carrier gas from the exhaust opening towards the fluid face of the cleaning fluid.

2. A device for drying substrates comprising:
a processing container configured to contain a cleaning fluid, house substrates and lower a fluid face of the cleaning fluid within the processing container with respect to the substrates; and
drying fluid supplying means for conveying a liquid drying fluid to an exhaust opening of a nozzle using a carrier gas, and for simultaneously blowing the drying fluid and the carrier gas from the exhaust opening towards the fluid face of the cleaning fluid.

3. The device for drying substrates as set forth in claim 2, wherein
the drying fluid supplying means comprises a first feed pipe for supplying the carrier gas to the nozzle and a second feed pipe for supplying the liquid drying fluid which is communicated to the first feed pipe.

4. The device for drying substrates as set fort in claim 2, wherein
the drying fluid supplying means comprises a first feed pipe for supplying the carrier gas to the nozzle and a second feed pipe for supplying the liquid drying fluid to the nozzle, the first feed pipe and the second feed pipe being independent from one another.

5. A device for drying substrates comprising:
a processing container configured to contain a cleaning fluid, house substrates and lower a fluid face of the cleaning fluid within the processing container with respect to the substrates; and
a drying fluid supplying mechanism configured and arranged to convey a liquid drying fluid to an exhaust opening of a nozzle using a carrier gas and simultaneously blow the drying fluid and the carrier gas from the exhaust opening towards the fluid face of the cleaning fluid.

6. The device for drying substrates as set forth in claim 5, wherein
the drying fluid supplying mechanism comprises a first feed pipe configured and arranged to supply the carrier gas to the nozzle and a second feed pipe configured and arranged to supply the liquid drying fluid which is communicated to the first feed pipe.

7. The device for drying substrate as set fort in claim 5, wherein
the drying fluid supplying mechanism comprises a first feed pipe configured and arranged to supply the carrier gas to the nozzle and a second feed pipe configured and arranged to supply the liquid drying fluid to the nozzle, the first feed pipe and the second feed pipe being independent from one another.

* * * * *